(12) United States Patent
Watanabe et al.

(10) Patent No.: US 7,679,391 B2
(45) Date of Patent: Mar. 16, 2010

(54) TEST EQUIPMENT AND SEMICONDUCTOR DEVICE

(75) Inventors: Daisuke Watanabe, Tokyo (JP); Toshiyuki Okayasu, Tokyo (JP)

(73) Assignee: Advantest Corporation, Tokyo (JP)

(*) Notice: Subject to any disclaimer, the term of this patent is extended or adjusted under 35 U.S.C. 154(b) by 52 days.

(21) Appl. No.: 12/172,159

(22) Filed: Jul. 11, 2008

(65) Prior Publication Data

US 2010/0007366 A1    Jan. 14, 2010

(51) Int. Cl.
*G01R 31/02*    (2006.01)
(52) U.S. Cl. .................................................. 324/763
(58) Field of Classification Search ................. 324/765, 324/763, 760, 158.1; 714/699, 716; 257/48; 438/14–19; 365/185, 13, 33
See application file for complete search history.

(56) References Cited

U.S. PATENT DOCUMENTS

| | | | | |
|---|---|---|---|---|
| 5,995,731 A * | 11/1999 | Crouch et al. ................. 716/4 |
| 6,587,979 B1 | 7/2003 | Kraus et al. .................. 714/720 |
| 6,671,844 B1 | 12/2003 | Krech, Jr. et al. ........... 714/736 |
| 7,253,652 B2 * | 8/2007 | Azimi et al. ................. 324/763 |
| 2004/0006729 A1 | 1/2004 | Pendurkar .................... 714/733 |
| 2004/0239359 A1 | 12/2004 | Matsumoto ................. 324/763 |

* cited by examiner

*Primary Examiner*—Ha Tran T Nguyen
*Assistant Examiner*—Tung X Nguyen
(74) *Attorney, Agent, or Firm*—Martine Penilla & Gencarella, LLP (57) ABSTRACT

An interface circuit is connected to an ATE via a test control bus BUS3 that differs from main buses, receives a control signal output from the ATE, and controls multiple BIST circuits according to the control signal. Furthermore, a DUT is configured such that a test result signal specified by the control signal can be read by the ATE via the test control bus. A BISI synchronous control unit generates a first control signal for individually controlling the multiple BIST circuits included in the DUT, and a second control signal for reading the test result signal generated by the BIST circuit, and supplies these signals to the DUT via the test control bus.

17 Claims, 6 Drawing Sheets

TEST EQUIPMENT AND SEMICONDUCTOR DEVICE

BACKGROUND OF THE INVENTION

1. Field of the Invention

The present invention relates to a test technique for a semiconductor device.

2. Description of the Related Art

In order to test a semiconductor device at low cost, a BIST (Built-In Self Test) circuit is employed. The BIST circuit thus employed provides diagnosis of defective portions and a quality check by writing and reading a defined input/output signal at a low speed to/from a device under test (which will be referred to as a "DUT" hereafter) without involving high-cost semiconductor automatic test equipment (which will be referred to as "ATE" hereafter). In particular, with regard to BISTs for memory circuits and logic circuits, many actual results and research results have accumulated. BISTs for such circuits have been implemented in production tests. The standard IEEE1149.1 was formulated by the JTAG (Joint Test Action Group) in 1990. This standard integrates the method for the boundary scan test and the input/output signals necessary for the boundary scan test. The JTAG standard (which is also simply referred to as "JTAG") provides specifications which employ 5-bit input/output signals, i.e., the test data input TDI, the test data output TDO, the test clock TCK, the test mode select TMS, the test reset TRST (option), used for accessing the BIST circuit included in the DUT in the form of a built-in circuit, thereby providing a boundary scan test.

In many cases, the boundary scan test performed in the BIST for memory or a logic circuit is a method in which multiple flip-flops or latches provided at a circuit boundary are connected in series in the form of a daisy chain so as to write and read data. Specifically, serial data is input at a low speed via a test data input port, the data held by a flip-flop or a latch at a boundary is serially read in a given state of the DUT, and the data thus read out is compared with an expected value. Accordingly, in a case in which only the boundary scan test is performed, a small-scale apparatus or an electronic calculator (computer) having a 5-bit parallel I/O port is sufficient as a resource for the JTAG signals.

However, in many cases, in order to ensure the quality of the DUT, there is a need to perform a DC test and an input leak test, in addition to the BIST test. No test system has been proposed without involving ATE throughout all of its steps. Accordingly, some input/output ports of the ATE for performing the DC test etc., are assigned to the JTAG ports (which are also referred to as "test access ports TAP") of the DUT. With such an arrangement, both the BIST test and the DC test are executed using a single ATE. In general, ATE devices that are capable of inputting/outputting signals at a high speed is costly according to the signal input/output speed, leading to increased test cost. Accordingly, in a case in which devices are shipped with only a basic quality guarantee, a low-cost ATE is sufficient, which generates only a low-speed signal. Currently, BIST-optimized BIST testers and so on are available.

The effectiveness of the BIST has been sufficiently proven with respect to logic circuits and memory circuits. Accordingly, there have been attempts to expand the use of the BIST to include a function of testing an analog circuit, and to provide an integrated BIST for a digital-analog mixed LSI (Large Scale Integration). There are already many research results with regard to the loopback test, which is a test in the BIST method for testing a high-speed I/F circuit which is a kind of analog circuit block. The loopback test has been implemented in production tests. Also, in the future, a BIST for an interface circuit between a digital block and an analog block, such as an A/D converter, D/A converter, etc., and a BIST for a front-end or a back-end of a wireless communication LSI, will be put to practical use.

In view of such situations, in the near future, it will be possible to provide multiple kinds of BISTs for a single DUT such as a SoC (System On a Chip) or SiP (System in a Package) on which memory circuits, logic circuits, analog circuits, A/D converters, D/A converters, high-speed I/F circuits are monolithically mounted. Improved microfabrication of the semiconductor process allows the increased circuit area (overhead) for the BIST circuit to be ignored. This permits the test items provided by the BIST to be increased. Accordingly, more BIST circuits will be mounted. Furthermore, the advantages of the BIST include a function of checking the internal circuit state of the DUT, which cannot be observed via an external port. This provides very effective information for defect analysis and for improving yield with respect to SoC devices integrally including multiple functions.

In such circumstances, as a result of examining DUTs having multiple BIST functions, the inventors have come to recognize the following problems.

1. In a case in which there are multiple BISTs according to respective control specifications independent of one another, there are differences in the control commands and the expected value comparison procedure among the BIST circuits, leading to a complicated control operation of the ATE for the BISTs provided by the DUT. This leads to increased test time and redundant test resources.

2. In a case in which the BIST circuits perform operations linked together or synchronized with one another, there is a need for the ATE to access each BIST circuit at the same time. Such an arrangement requires independent external access ports (TAPs) in increments of BIST circuits. This reduces the number of ports which can be assigned to the functions and operations of the DUT which are to be performed in the normal mode.

3. In the future, it is possible that there will be a need to provide multiple BISTs and a normal test (test in which the ATE accesses the normal input/output ports of the DUT) linked together or synchronized with one another. The current method does not support the linkage of the BISTs and the normal test, i.e., such a test cannot be performed.

SUMMARY OF THE INVENTION

The present invention has been made in view of such situations. Accordingly, it is a general purpose of the present invention to provide a method for integrally controlling multiple BIST circuits.

An embodiment of the present invention relates to a test apparatus for a semiconductor device. The semiconductor device, which is a device under test (DUT), includes multiple function blocks, multiple BIST circuits, and an interface circuit. The multiple function blocks input/output signals via a main bus, and execute predetermined signal processing. The multiple BIST circuits are provided in increments of function blocks, and each of which tests the corresponding function block, and generates a test result signal in the form of a digital signal according to the test result. The interface circuit is connected to the test apparatus via a test control bus that differs from the main bus, and receives a control signal output from the test apparatus. The interface circuit is configured such that (1) the interface circuit controls the multiple BIST circuits according to the control signal, and such that (2) the test result signal specified according to the control signal can be read out via the test control bus by the test apparatus. The test apparatus includes a test unit and a control unit. The test unit transmits/receives signals to/from the semiconductor device via the main bus, and instructs at least one of the function blocks to execute predetermined signal processing. The control unit generates a first control signal for individually controlling the multiple BIST circuits included within the semiconductor device, and a second control signal for reading out the test result signal generated by the BIST circuit from the interface circuit included within the semiconductor device, and supplies the first control signal and the second control signal to the semiconductor device via the test control bus.

With such an embodiment, an integrated interface is provided for the multiple BIST circuits, thereby controlling the BIST circuits included in the DUT. Furthermore, such an arrangement allows the test result signal generated by each BIST circuit to be acquired. The "test result signal" may be the judgment result of whether or not the function block to be tested is operating normally. Also, the "test result signal" may be intermediate data obtained in an intermediate step in the test. Also, "transmission/reception" as used here represents at least data transmission or data reception.

The first control signal generated by the control unit may include at least a selection signal which indicates the BIST circuit that is to be set to the active state from among the multiple BIST circuits.

At least one of the multiple BIST circuits may be configured such that it can be switched among multiple modes. The selection signal may include mode data for setting the mode.

The control unit may further generate a third control signal including a test pattern to be supplied to each BIST circuit, and may supply the third control signal to the semiconductor device via the test control bus.

With such an arrangement, a test pattern generated by the test apparatus is supplied to the function block, and the result obtained by processing the test pattern can be acquired.

Also, the control unit may further generate a fourth control signal for instructing the BIST circuit to start or stop the test, and may supply the fourth control signal to the semiconductor device via the test control bus.

The control unit may generate an option signal used for performing a unique control operation on at least one of the multiple BIST circuits. The test control bus may include another signal line for transmitting the option signal, which differs from the first and second control signals.

With such an arrangement, the option signal is provided. Thus, the designer of the DUT 200 can assign the option signal to the BIST circuit which is requested to perform multi-bit transmission.

In a state in which the test unit transmits/receives signals to/from the semiconductor device, and at least one of the function blocks executes the predetermined signal processing, the control unit may set the BIST circuit that corresponds to that function block to the active state, thereby testing that function block.

Such an arrangement allows the built-in self test (BIST) to be executed using a signal transmitted/received via the main bus.

The test apparatus may further include a synchronous control unit which receives the control signal generated by the control unit, and outputs the control signal synchronously with the test rate provided by the test unit.

With such an arrangement, the control signal is supplied to the DUT synchronously with the test rate. Thus, such an arrangement allows the built-in self test (BIST) to be executed synchronously with the test rate while changing the test rate in a real-time manner.

Of the multiple BIST circuits, the BIST circuit having the same function may be shared by multiple function blocks.

At least one of the BIST circuits may allow a calibration signal to be input via a calibration bus. The test unit of the test apparatus may be configured such that it is capable of generating a calibration signal. The control unit may acquire the test result signal generated as a result of the calibration signal processing performed by the BIST circuit, and may generate a fifth control signal for calibrating the BIST circuit according to the test result signal.

With such an arrangement, the BIST circuit can be calibrated using the calibration signal generated by the test apparatus side.

Another embodiment of the present invention relates to a semiconductor device. The semiconductor device includes multiple function blocks, multiple BIST circuits, and an interface circuit. The multiple function blocks perform input/output of signals via a main bus, and execute predetermined signal processing. The multiple BIST circuits are provided in increments of multiple function blocks. Each of the BIST circuits tests the corresponding function block, and generates a test result signal in the form of a digital signal according to the test results. The interface circuit receives a control signal output from the test apparatus via a test control bus that differs from the main bus. The interface circuit is configured such that, (1) the multiple BIST circuits are controlled according to a control signal, and (2) the test result signal specified according to the control signal can be read out via the test control bus by the test apparatus.

With, such an embodiment, an integrated interface is provided for the multiple BIST circuits, thereby allowing the multiple BIST circuits included in the DUT to be integrally controlled by the test apparatus. Furthermore, such an embodiment allows the test apparatus to read out the test result signal generated by each BIST circuit.

The control signal may include at least a selection signal which indicates which of the multiple BIST circuits is to be set to the active state, and a test data input signal including a test pattern to be supplied to the BIST circuit set to the active state. The BIST circuit set to the active state according to the selection signal may receive the test data input signal, and may test the corresponding function block.

At least one of the multiple BIST circuits may be configured such that it can be switched among multiple modes. The interface circuit may set the mode of the BIST circuit according to the mode data included in the selection signal.

The BIST circuit set to the active state according to the selection signal may start or stop a test according to a start/stop signal included in the control signal.

In a state in which at least one function block executes the predetermined signal processing, the BIST circuit that corresponds to that function block may test that function block.

Of the multiple BIST circuits, the BIST circuit having the same function may be shared by multiple function blocks.

At least one of the BIST circuits may allow a calibration signal to be input via a calibration bus. The BIST circuit may output the result that is obtained by processing the calibration signal as the test result signal.

It is to be noted that any arbitrary combination or rearrangement of the above-described structural components and so forth is effective as and encompassed by the present embodiments.

Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

These components shown in the drawings in the form of function blocks that provide various processing can be realized by hardware means, e.g., by actions of a CPU, memory, and other LSIs, or by software means, e.g., by actions of a program loaded into the memory. Accordingly, such function blocks can be realized by hardware components alone, software components alone, or various combinations thereof, which can be readily conceived by those skilled in this art. That is to say, each function block is not restricted to hardware components alone or software components alone.

Figure 1:
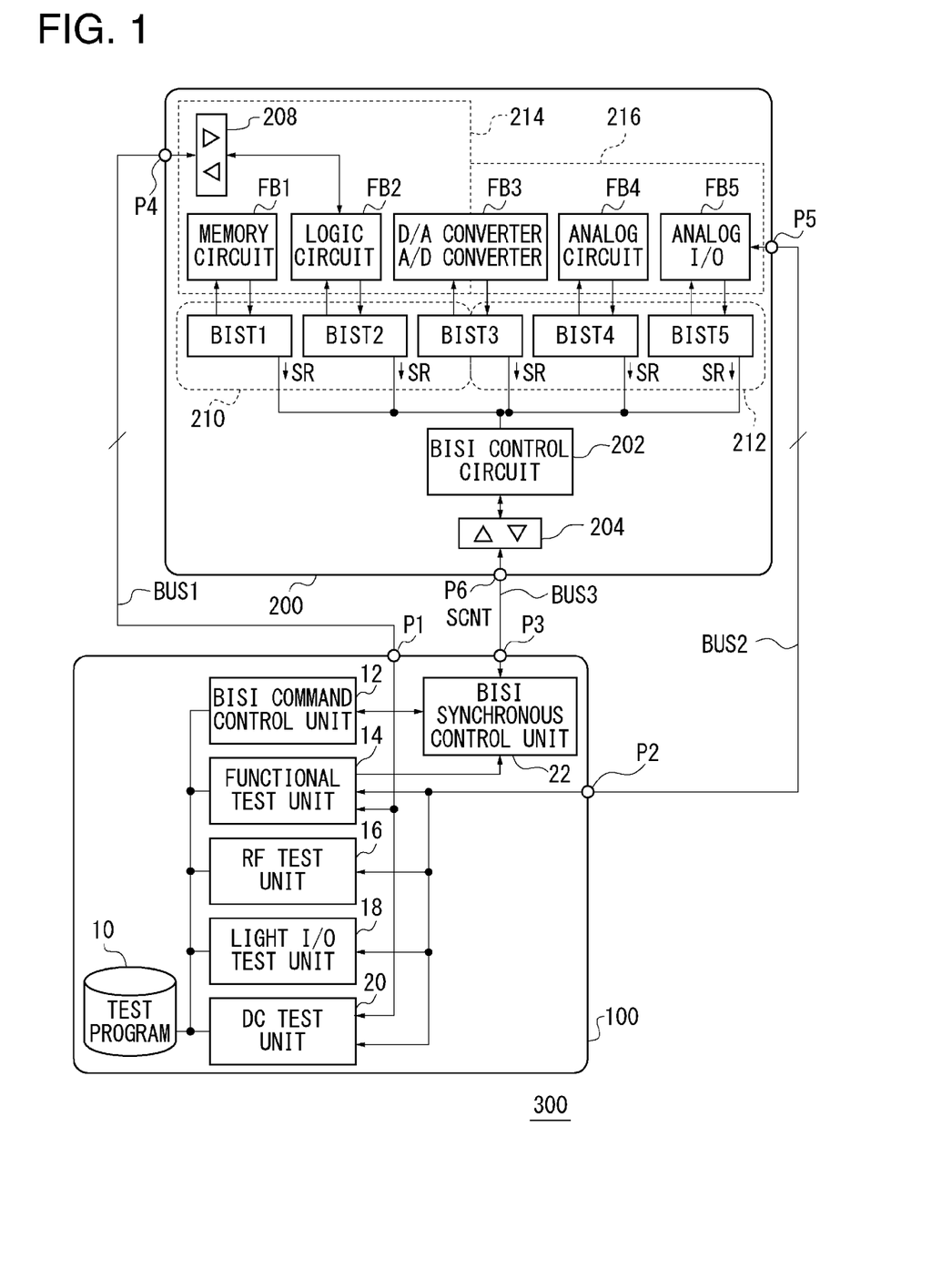
FIG. 1 is a block diagram which shows a test system including an ATE and a DUT according to an embodiment.

FIG. 1 is a block diagram which shows a test system 300 including semiconductor automatic test equipment (which will be referred to as the "ATE" hereafter) 100 and a DUT 200 according to an embodiment. FIG. 1 shows only the components related to the present invention, and the signal lines and blocks having no essential relation with the present invention, such as a power supply etc., are omitted.

The ATE 100 according to the present embodiment is configured based upon the DUT 200 having novel features according to the embodiment. In the same way, the DUT 200 according to the embodiment is configured based upon the ATE 100 having novel features. That is to say, the present invention provides the ATE 100 and the DUT 200 each of which has a novel architecture that differs from conventional architectures, which allows multiple BIST circuits to be controlled in a simple manner. Furthermore, such an arrangement provides various test methods which cannot be provided by the conventional JTAG.

First, description will be made regarding the configuration of the DUT 200. Subsequently, description will be made regarding the ATE 100.

The DUT 200 includes multiple function blocks FB1 through FB5, multiple BIST circuits BIST1 through BIST5, a BISI control circuit 202, an I/O buffer 204, and an I/O buffer 208.

The multiple function blocks FB1 through FB5 and the I/O buffer 208 transmit/receive signals to/from an external circuit via a digital main bus BUS1 and an analog input/output port in the normal operation mode (i.e., in the state in which they are mounted as a set), and execute predetermined signal processing synchronized with, and in cooperation with, one another. The content of the signal processing is not restricted in particular. A desired LSI may be assumed to be the DUT 200.

In order to facilitate understanding, description will be made below regarding an arrangement in which the DUT 200 is an analog-digital mixed integrated circuit. The DUT 200 transmits/receives a digital signal via the digital main bus BUS1 connected to a digital I/O (Input/Output) port P4, and transmits/receives an analog signal via an analog input/output signal path connected to an analog I/O port P5. The digital signals transmitted via the digital main bus BUS1 are binary digital signals provided by a conventional logic I/O such as a TTL (Transistor Transfer Logic), DTL (Diode-Transistor Logic), ECL (Emitter Coupled Logic), CML (Current Mode Logic), CMOS (Complementary Metal Oxide Semiconductor), SSTL (Stub Series Terminated Logic), LVDS (Low Voltage Differential Signaling), etc. The digital signal input/output via the digital main bus BUS1 can be transmitted/received via an input/output port (digital I/O port P1) of an existing ATE 100.

Furthermore, examples of the analog signals transmitted via the analog input/output port include a high-speed I/F input/output signal, an optical signal, a multi-level modulation signal (ASK, FSK, PSK), an RF analog signal (amplitude modulation, frequency modulation, phase modulation), a wireless signal, none of which is a simple binary digital signal. In a case in which the analog signal is an optical signal, an optical fiber is used as the analog input/output port. In a case in which an RF analog signal is input/output, a cable or a transmission line having a predetermined characteristic impedance (50Ω or 75Ω) is used as the analog input/output port. In a case in which a wireless signal is input/output, the atmosphere is used as the analog input/output port. Accordingly, the term "analog input/output port" as used in this specification represents a broad concept including both a wired analog input/output port and a wireless analog input/output port. In order to transmit/receive analog signals, the ATE 100 includes another analog I/O port P2 which differs from the digital I/O port P1. The digital main bus BUS1 may have a desired bus width (the number of bits). Furthermore, the analog input/output port may have a desired number of ports.

In general, the analog-digital mixed circuit is roughly classified into a digital block 214 and an analog block 216.

To facilitate understanding, description will be made below regarding an arrangement in which the function block FB1 is a memory circuit, the FB2 is a logic circuit, the FB3 is a D/A-A/D converter circuit, the FB4 is an analog circuit, and the FB5 is an analog I/O circuit. The I/O buffer 208 is buffer which allows data to be input/output from/to an external circuit connected to the digital main bus BUS1. The logic circuit FB2 receives a digital signal input from an external source via the I/O buffer 208, and performs predetermined signal processing. The memory circuit FB1 can be accessed via the logic circuit FB2, and holds various kinds of data.

That is to say, the I/O buffer 208, the memory circuit FB1, the logic circuit FB2, and a part of the D/A-A/D converter FB3 belong to the digital block 214.

The analog I/O circuit FB5 inputs/outputs data from/to an external circuit connected via the analog input/output port. Examples of the analog I/O circuits assumed for the FB5 include: a high-speed I/F circuit which transmits/receives signals as stipulated by the HDMI (High Definition Multimedia Interface) standard, an optical I/O circuit which transmits/receives optical signals; an I/O circuit which transmits/receives multi-level modulation signals, etc. Alternatively, the analog I/O circuit FB5 may be an antenna or a wireless interface which receives a wireless signal.

The analog circuit FB4 includes several circuits selected according to the functions of the DUT 200 from among an RF transmission/reception circuit, a quadrature modulation/demodulation circuit, a multi-level modulation/demodulation circuit, an FFT (Fast Fourier Transform) circuit, an IFFT (Inverse FFT) circuit, a filter, an oscillator, an equalizer, a mixer, a power supply circuit, a band gap regulator, etc.

The analog circuit FB4, the analog I/O circuit FB5, and a part of the D/A-A/D converter FB3 belong to the analog block 216.

The D/A converter included in the D/A-A/D converter FB3 converts a digital signal generated by the logic circuit FB2 side into an analog signal, and supplies the analog signal thus converted to the analog block. Furthermore, the A/D converter included in the D/A-A/D converter FB3 converts an analog signal generated by the analog block side into a digital signal, and supplies the digital signal thus converted to the digital block. That is to say, the D/A-A/D converter FB3 provides a function as an interface between the digital block 214 and the analog block 216.

The multiple BIST circuits BIST1 through BIST5 are provided for the respective function blocks FB1 through FB5. Each BIST circuit tests the corresponding function block, and generates a test result signal SR in the form of a digital signal based upon the test results. The "test result signal" may be generated based upon the determination result of whether the function block FB which is the test target is normal or defective, or intermediate data obtained in an intermediate step in the test.

The items and the content of the test provided by the BIST circuit are determined based upon the content of the signal processing performed by the function blocks FB1 through FB5. In other words, the designer of the DUT 200 designs each BIST circuit so as to ensure the normal operation of the corresponding function block, or so as to allow defective portions to be detected. A part of the BIST circuits, i.e., the BIST1, the BIST2, and a part of the BIST3 will be referred to as the "digital BIST group 210". The other part of the BIST circuits, i.e., the other part of the BIST3, the BIST4, and the BIST5 will be referred to as the "analog BIST group 212".

Specifically, the BIST circuits BIST1 and BIST2 are circuits which test the memory circuit FB1 and the logic circuit FB2, respectively. Accordingly, such a BIST circuit may be configured in the form of a conventional boundary scan test circuit. Also, the control operations of the BIST1 and the BIST2 may be designed according to the JTAG standard. However, in a case in which the JTAG standard is employed, the test cannot be performed for the function blocks FB1 and FB2 in the actual operating state or at the actual operating speed. Accordingly, the designer may design his/her own BIST circuit which allows the test to be performed in the actual operating state and at the actual operating speed without involving the JTAG standard.

On the other hand, the boundary scan test cannot be applied to the D/A-A/D converter FB3, the analog circuit FB4, and the analog I/O circuit FB5. That is to say, the control operation according to the JTAG standard is insufficient for such circuits. Such a circuit requires more advanced control operations as compared with the boundary scan test.

The BIST circuit for an analog circuit can be regarded as a circuit formed by integrating so-called measurement devices such as a mixer circuit, an arbitrary waveform generator, a digitizer, etc., which will be described later in detail. Accordingly, from this point of view, the BIST circuit (which is also be referred to as the "analog BIST circuit") for the analog circuit can be regarded as a built-in measurement device (Built-in Instruments). In the same way, the digital BIST circuit can be regarded as a measurement device block included in the digital domain.

It should be noted that a BIST may be provided for the I/O buffer 208 as a test target. For example, the test may be made with the I/O buffer 208 as a part of the logic circuit that belongs to the function block FB2. Also, a dedicated BIST for the I/O buffer may be provided as a function block FB0.

The DUT 200 includes a test I/O port P6 which differs from the main bus BUS1 and the analog I/O port, and which is connected to a test control bus BUS3. The I/O buffer 204 is provided in order to allow a binary digital signal to be input and output via the test I/O port P6.

Via the test control bus BUS3, the interface circuit 202 receives a first control signal SCNT1 and a second control signal SCNT2 output from the ATE 100. The interface circuit 202 controls the multiple BIST circuits BIST1 through BIST5 according to the first control signal SCNT1. Furthermore, the interface circuit 202 is configured such that the interface circuit 202 outputs the test result signal SR specified by the control signal SCNT2 to the ATE 100 side via the test control bus BUS3 from among the test result signals SR generated by the BIST circuits.

The interface circuit 202 integrally controls the analog BIST, in addition to the conventional memory BIST and logic BIST. The interface circuit 202 provides an integrated interface for multiple BIST circuits having respective signal input/output formats and control command sets that differ from one another. This provides a standard interface for the built-in measurement devices (Built-in Instruments Standard Interface, which will be abbreviated to "BISI" hereafter) between the ATE 100 and the DUT 200. From this point view, the interface circuit 200 will also be referred to as the "BISI control circuit".

The BISI control circuit 202 thus employed provides a test environment which allows the BIST circuits and the ATE 100 to execute multiple tests at the same time in cooperation with, and synchronized with, one another. Description will be made later regarding the operation of the BISI control circuit 202.

The above is the configuration of the DUT 200. Next, description will be made regarding the configuration of the ATE 100 which tests the DUT 200.

The ATE 100 includes a test program 10, a BISI command control unit 12, a functional test unit 14, an RF test unit 16, an optical I/O test unit 18, a DC test unit 20, and a BISI synchronous control unit 22.

The test program 10 is programmed beforehand by the user, and defines the sequence of the test processing. The ATE 100 tests the DUT 200 according to the sequence defined by the test program 10.

The analog I/O port P1 of the ATE 100 is connected to a digital I/O port P4 of the DUT 200. The analog I/O port P2 of the ATE 100 is connected to the analog I/O port P5 of the DUT 200. Furthermore, a test I/O port P3 of the ATE 100 is connected to the test I/O port P6 of the DUT 200 via the test control bus BUS3.

The ATE 100 and the DUT 200 performs transmission/reception of digital signals via the digital main bus BUS1.

That is to say, the ATE 100 is capable of outputting (writing) data to the DUT 200, and is capable of reading data from the DUT 200.

Furthermore, the ATE 100 and the DUT 200 perform transmission/reception of analog signals via an analog main bus BUS2. That is to say, the ATE 100 is capable of transmitting data to the DUT 200, and is capable of receiving data output from the DUT 200.

The functional test unit 14 performs function testing of the DUT 200 via at least either the digital main bus BUS1 or the analog input/output port. Examples of the function test will be described below.

Function test 1. The functional test unit 14 outputs predetermined pattern data via the digital main bus BUS1 so as to write the data to the memory circuit FB1 of the DUT 200. Subsequently, the data thus written is read out from the memory circuit FB1 via the digital main bus BUS1, and comparison is made whether or not the data thus read out matches its expected value. As a result, determination is made whether or not the data access function of the memory circuit FB1 is operating normally.

Function test 2. The functional test unit 14 outputs predetermined pattern data via the digital main bus BUS1 so as to instruct the logic circuit FB2 to execute predetermined signal processing. The data obtained as a result of the signal processing is read out via the digital main bus BUS1, and comparison is made whether or not the data thus read out matches the expected data. Thus, determination is made whether or not the logic circuit FB2 is operating normally.

Function test 3. Via the analog input/output port, the functional test unit 14 outputs an analog signal obtained by modulating predetermined pattern data. The signal processing is executed by the memory circuit FB1 to the analog I/O circuit FB5. In some cases, the results of the signal processing are output to the ATE 100 via the digital main bus BUS1 in the form of a digital signal. In some cases, the results of the signal processing are output to the ATE 100 via the analog input/output port in the form of an analog signal. The functional test unit 14 compares the results of the signal processing performed by the DUT 200 with expected values, and determines whether or not the overall operation of the DUT 200 is normal. In this case, the signal processing of the logic circuit FB2 can be controlled via the digital main bus BUS1.

The DC test unit 20 performs a DC test. In general, the DC test unit 20 and the functional test unit 14 execute the DC test in cooperation with each other. The functional test unit 14 generates predetermined pattern data and a command, and the pattern data and the command thus generated are supplied to the logic circuit FB2 via the digital main bus BUS1. Alternatively, the functional test unit 14 generates an analog signal obtained by modulating predetermined pattern data, and the analog signal thus generated is supplied to the analog circuit FB4 via the analog main bus BUS2. As a result, the logic circuit FB2 is set to a predetermined state, whereupon a predetermined signal level (high level or low level) occurs at the digital I/O port P4. In this state, the DC test unit 20 measures the DC signal level (current level or current level) that occurs at the digital I/O port P4, and determines whether or not the DUT 200 is operating normally. For example, if, in the normal state, the signal level at the digital I/O port P4 is the high level, in a case in which the electric potential measured by the DC test unit 20 is smaller than a threshold level VH, determination is made that the DUT 200 is defective. Also, if, in the normal state, the signal level at the digital I/O port P4 is the low level, in a case in which the electric potential measured by the DC test unit 20 is greater than a threshold level VL, determination is made that the DUT 200 is defective.

Alternatively, by supplying a predetermined pattern to the DUT 200, the analog I/O circuit FB5 is set to a predetermined state. In this state, a predetermined signal level occurs at the analog I/O port P5. In this state, the DC test unit 20 measures the DC signal level that occurs at the analog I/O port P5, and determines whether or not the DUT 200 is operating normally.

Furthermore, the DC test unit 20 supplies a predetermined voltage to the digital I/O port P4 and the analog I/O port P5, measures the DC leak current that flows into the DUT 200 side, and determines whether or not the DUT 200 is operating normally.

It should be noted that, while FIG. 1 shows only a single signal line for each of the digital main bus BUS1 and the analog input/output port, multiple signal lines may be provided. In this case, the DC test is performed for all the signal lines, i.e., for the multiple digital I/O ports P4 and the multiple analog I/O ports P5.

The RF test unit 16 is provided in an arrangement in which the DUT 200 performs processing on an RF signal. The RF test unit 16 has a function of generating an RF signal to be supplied to the DUT 200. Furthermore, examples of the functions of the RF test unit 16 include: a function of receiving an RF signal (analog signal) output from the DUT 200; a function of extracting a symbol by demodulating the RF signal thus received; a function of measuring an eye pattern so as to measure the eye aperture ratio; a function of measuring a spectrum; and a function of performing constellation mapping.

Furthermore, the RF test unit 16 is used jointly in the above-described function test. The RF test unit 16 converts predetermined pattern data generated by the functional test unit 14 into an RF signal, and outputs the RF signal thus converted to the DUT 200 via the analog input/output port.

The optical I/O test unit 18 is provided in an arrangement in which the DUT 200 performs processing on an optical signal. The optical I/O test unit 18 has a function of receiving an optical signal (analog signal) output from the DUT 200, a function of extracting a symbol by demodulating the optical signal thus received, and a function of performing various kinds of tests.

Furthermore, the optical I/O test unit 18 is used jointly in the above-described function test. The optical I/O test unit 18 performs optical modulation using predetermined pattern data generated by the functional test unit 14, and outputs the optical data thus optical modulated to the DUT 200 via an analog input/output port (optical cable).

The BISI command control unit 12 generates the first control signal SCNT1 through fourth control signal SCNT4 according to the commands included in the test program 10 provided by the user. The first control signal SCNT1 is a signal for controlling the multiple BIST circuits BIST1 through BIST5 included within the DUT 200. The second control signal SCNT2 is a signal for acquiring the test result signal SR. The third control signal SCNT3 is a signal including a test pattern to be supplied to each of the BIST circuits. The fourth control signal SCNT4 is a start/stop signal START/STOP, which instructs each BIST circuit to start or stop the test operation.

These control signals SCNT1 through SCNT4 (which will be referred to collectively as the "control signals SCNT" hereafter) are subjected to retiming processing by the BISI synchronous control unit 22 described later, and the control signals SCNT are output to the BISI control circuit 202 via the test control bus BUS3.

Figure 2:
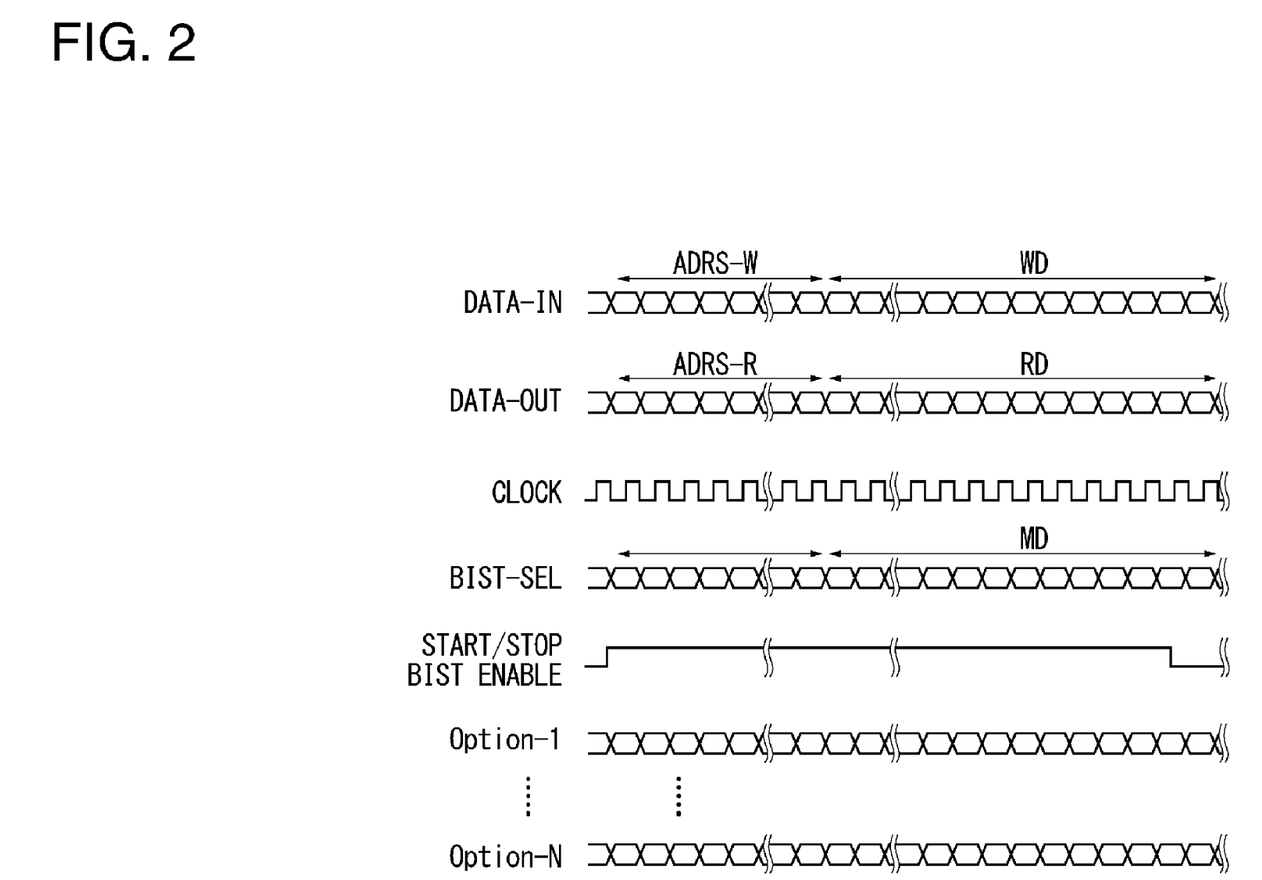
FIG. 2 is a diagram which shows a format of a control signal transmitted via a test control bus.

Description will be made regarding the relation between the format of the control signals SCNT and the test control bus BUS3. FIG. 2 is a diagram which shows the format of the control signals SCNT transmitted via the test control bus. The test control bus BUS3 includes a test data input line DATA-IN, a test data output line DATA-OUT, a clock line CLOCK, a BIST selection line BIST-SEL, a start/stop line START/STOP, and option expansion lines Option-1 through Option-N. The control signals SCNT1 through SCNT4 are transmitted via these signal lines.

The BIST selection signal BIST-SEL is transmitted via the BIST selection line BIST-SEL. The BIST-SEL is used for specifying the BIST circuit that is to execute a test operation from among the multiple BIST circuits BIST1 through BIST5. The BIST selection signal BIST-SEL is a part of the aforementioned first control signal SCNT1.

The BIST selection signal BIST-SEL includes a BIST address ADRS_B and mode data MD. A BIST address ADRS_B is assigned to each BIST circuit. In a case in which each BIST circuit has only a simple function of switching the operation between the ON state and the OFF state, the mode data MD is single-bit data which changes between binary values, i.e., 1 (assert), which is used as an instruction to perform the operation, and 0 (negate), which is used as an instruction to stop the operation.

The BISI command control unit 12 writes the mode data MD to the BIST address ADRS_B of each of the multiple BIST circuits BIST1 through BIST5. For example, if the first and second BIST circuits BIST1 and BIST2 are to be set to the active state, and the other BIST circuits BIST3 through BIST5 are set to the non-active mode, the mode data MD for which the value is 1 is written to the BIST address of the first BIST circuit BIST1 and the BIST address of the second BIST circuit BIST2, and the mode data MD for which the value is 0 is written to the BIST address of each of the other BIST circuits BIST3 through BIST5.

In a case in which each BIST circuit has a function of executing multiple test items, or has a function of switching the operation mode, the mode data is used for switching such a test item or such an operation mode. In this case, the bit width of the mode data is defined based upon the number of modes among which the operation mode can be switched. For example, in a case in which each of the analog BIST circuits BIST3 through BIST5 can operate in any one of three modes, i.e., a first mode through a third mode, the bit width of each mode data is 2 bits. Specifically; the mode data can be set to any one of (00), which represents the non-active mode, and (01), (10), and (11), which represent the first mode through the third mode, respectively. It should be noted that there may be differences in the number of modes among the BIST circuits.

For example, let us consider a case in which the mode data (10) is written to the BIST address of the third BIST circuit BIST3, the mode data (01) is written to the BIST address of the fourth BIST circuit BIST4, and the mode data (00) is written to the BIST address of each of the other BIST circuits. In this case, the third BIST circuit BIST3 is set to the second mode, the fourth BIST circuit BIST4 is set to the first mode, and the other BIST circuits are set to the non-active mode.

The test data output line DATA-OUT is used for transmitting the data, which has been obtained as a result of the BIST, from the DUT 200 to the ATE 100. The second control signal SCNT2, which is used for acquiring the test result signal SR, is transmitted from the ATE 100 to the DUT 200 via the test data output line DATA-OUT. As a result of this data transmission, the test result signal SR is transmitted from the DUT 200 to the ATE 100 via the test data output line DATA-OUT.

In FIG. 2, the second control signal SCNT2 is shown as the address data ADRS_R. To the DUT 200, the ATE 100 transmits the address data ADRS_R, which is used to specify the address of each memory or register provided in the DUT 200 side. As a result, the test result signal SR stored at a specified address is transmitted to the ATE 100 as the readout data RD.

The third control signal SCNT3, which includes a test pattern to be supplied to each BIST circuit, is supplied from the ATE 100 to the DUT 200 via the test data input line DATA-IN. The third control signal SCNT3 includes address data ADRS_W, which represents the test pattern destination BIST circuit, and the write data WD which is a test pattern to be supplied to the BIST circuit.

The data transmission performed via the test data input line DATA-IN and the test data output line DATA-OUT may be implemented using a single line that provides bidirectional transmission such as an I2C bus, or using two separate lines.

The clock for synchronizing data transmissions via the test data input line DATA-IN, the test data output line DATA-OUT, and the BIST selection line BIST-SEL is transmitted via the clock line CLOCK.

The fourth control signal SCNT4 (which will also be referred to as the "start/stop signal"), which indicates the start timing or the stop timing for the BIST, is transmitted via the start/stop signal line START/STOP. When the start/stop signal START/STOP is asserted, the BIST circuit that has been set to the active mode starts the BIST operation. When the start/stop signal START/STOP is negated, the BIST circuit stops the BIST operation.

The option expansion lines Option-1 through Option-N are used for controlling the unique control operation of each BIST circuit. The option expansion line may be used as an input port for transmission of advanced and complicated control signals necessary for the analog BIST circuit. Alternatively, the option expansion line may be used as an output port for transmission of multi-bit data from the DUT 200 to the ATE 100.

Figure 3:
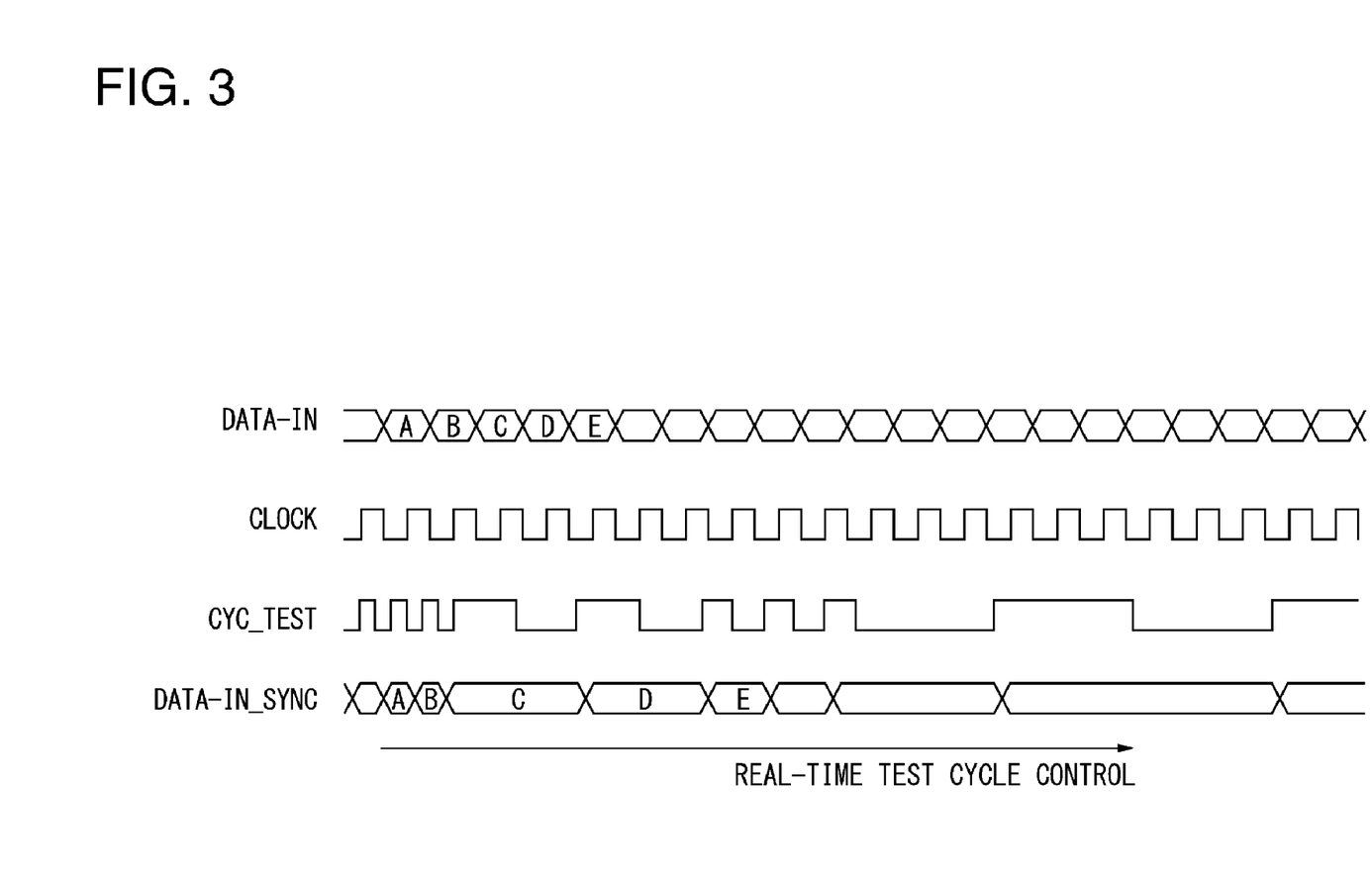
FIG. 3 is a time chart which shows the operation of a BISI synchronous control unit.

FIG. 3 is a time chart which shows the operation of the BISI synchronous control unit 22. In general, the ATE 100 is configured such that it can control the operation frequency of the DUT 200 in a real time manner in increments of clocks (test rate). For example, the DUT 200 operates at a normal operation clock during a certain period, operates at twice the normal clock (dual rate) in another period, and operates at half the normal clock (half rate) during yet another period. Accordingly, the cycle of the data, which is transmitted/received to/from the DUT 200 via the digital main bus BUS1, can also be changed as desired in a real time manner according to the test program 10.

In such a situation, the BISI synchronous control unit 22 synchronizes the data, which is transmitted via the test control bus BUS3, with the test cycle. The DATA-IN shown in FIG. 3 is data generated by the BISI command control unit 12, and is synchronous with a predetermined clock signal. CLOCK. The BISI synchronous control unit 22 receives the test data input signal DATA-IN synchronized with the clock CLOCK, and synchronizes the test data input signal DATA-IN thus received with the test cycle CYC_TEST. The test data input signal DATA-IN_SYNC thus synchronized is supplied to the DUT 200 via the test control bus BUS3.

The above is the overall configuration of the ATE 100.

Figure 4:
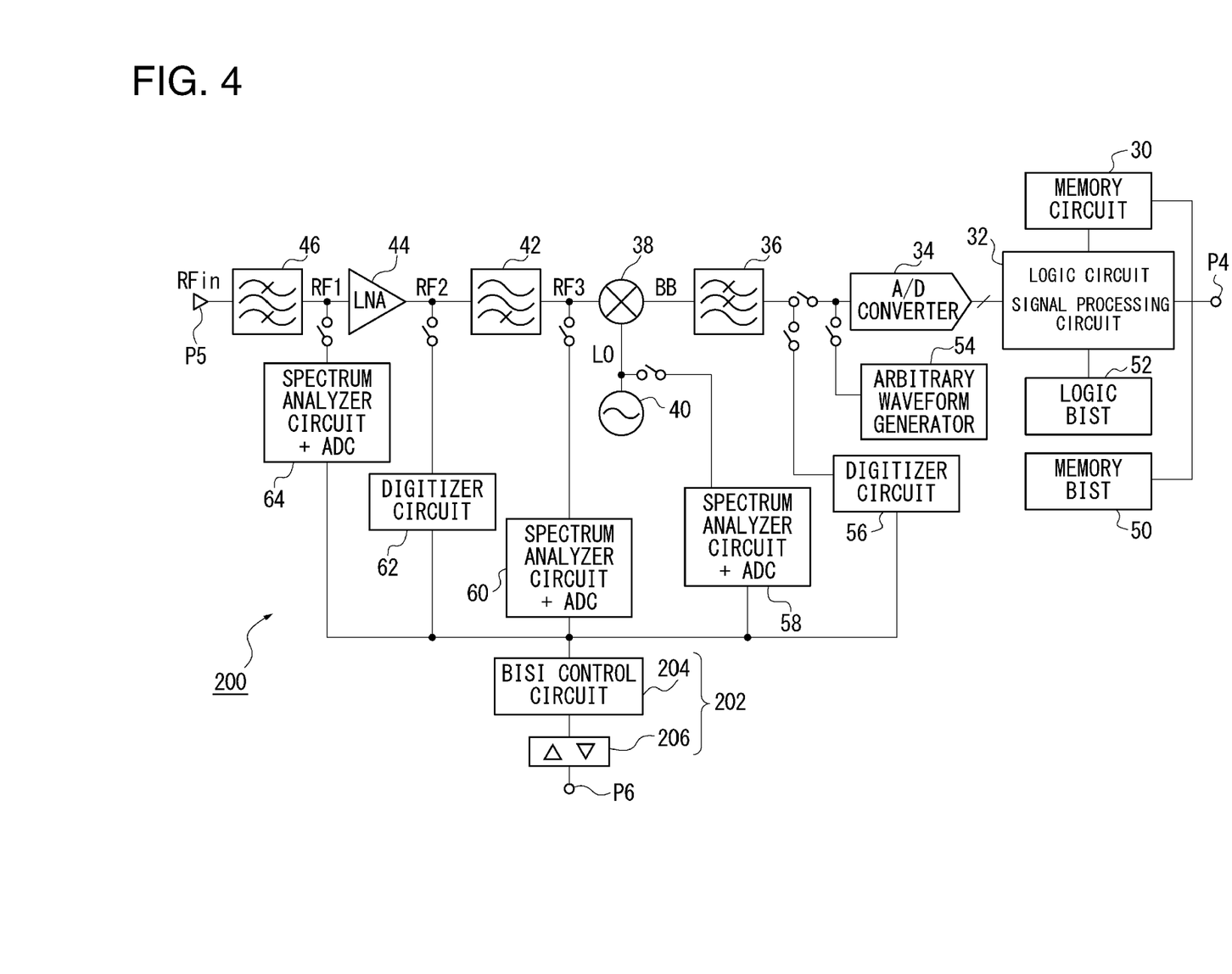
FIG. 4 is a block diagram which shows a specific configuration example of the DUT including multiple function blocks FB and multiple BIST circuits.

FIG. 4 is a block diagram which shows a specific configuration example of the DUT 200 including the multiple function blocks FB and the multiple BIST circuits. The DUT 200 shown in FIG. 4 is a superheterodyne receiver circuit.

The DUT 200 includes a memory circuit 30, a base band circuit 32, an A/D converter 34, an LPF (Low-Pass Filter) 36, a mixer 38, a local oscillator 40, an image removal filter 42, an LNA (Low Noise Amplifier) 44, and a BPF (Band-Pass Filter)

46, and further includes a memory BIST circuit 50, a logic BIST circuit 52, and analog BIST circuits 54, 56, 58, 60, 62, and 64, which test the aforementioned components.

An input RF signal RFin is input to the analog I/O port P5. The BPF 46 performs filtering processing on the RF signal (RFin) with the carrier frequency as the center frequency. The LNA 44 generates an RF signal RF2 by amplifying the RF signal RF1 thus filtered. The image removal filter 42 attenuates the image frequency so as to prevent image interference from occurring due to the down conversion performed in the downstream step, thereby generating an RF signal RF3. The local oscillator 40 oscillates at the same local frequency as the RF frequency (carrier frequency). The mixer 38 mixes the RF signal RF3, which is output from the image removal filter 42, with the local signal LO, thereby performing down conversion. In a case in which the RF signal RFin has been subjected to quadrature modulation, the mixer 38 outputs an analog base band signal which consists of the in-phase component BB_I and the quadrature component BB_Q. The analog base band signal BB is filtered by the LPF 36, and is converted into a digital value by the A/D converter 34. The output of the A/D converter 34 is input to the base band circuit 32, and is subjected to demodulation processing.

The memory circuit 30 and the base band circuit 32 shown in FIG. 4 correspond to the memory circuit FB1 and the logic circuit FB2 shown in FIG. 1. Furthermore, the A/D converter 34 shown in FIG. 4 corresponds to the D/A-A/D converter FB3 shown in FIG. 1. The LPF 36, the mixer 38, the local oscillator 40, the image removal filter 42, the LNA 44, and the BPF 46 shown in FIG. 4 correspond to the analog circuit FB4 shown in FIG. 1.

The memory BIST circuit 50 is a BIST circuit which tests the memory circuit 30. The logic BIST circuit 52 is a BIST circuit which tests the base band circuit 32. The memory BIST circuit 50 and the logic BIST circuit 52 execute a boundary scan test, for example.

The analog BIST circuits 54, 56, 58, 60, 62, and 64 correspond to the analog BIST group 212 shown in FIG. 1.

The analog BIST circuit 54 is an arbitrary waveform generator, and supplies an analog waveform to the input terminal of the A/D converter 34. In a case in which the analog BIST circuit 54 is set to the active state, the A/D converter 34 converts the analog waveform into a digital value. The base band circuit 32 performs predetermined signal processing on the digital value thus converted, and determines whether or not the A/D converter 34 is operating normally. Alternatively, an arrangement may be made in which the digital value is output to the ATE 100 (not shown) via the digital I/O port P4 without involving the signal processing by the base band circuit 32, and the quality check is left to the ATE 100.

The analog BIST circuits 56, 58, 60, 62, and 64 execute BISTs in a state in which an RF signal is supplied to the analog I/O port P5.

The analog BIST circuit 64 is provided for testing the BPF 46. The analog BIST circuit 64 includes a spectrum analyzer and an A/D converter, for example. In a step in which a test is performed by the analog BIST circuit 64, the ATE 100 (not shown) supplies a predetermined RF signal to the analog I/O port P5. The spectrum analyzer of the analog BIST circuit 64 converts the intensity of each band of the RF signal RF1 filtered by the BPF 46 into a digital value. The spectrum data thus obtained is compared with expected values. Thus, the analog BIST circuit 64 determines whether or not the BPF 46 is operating normally. Alternatively, the spectrum data is output as the test data output signal DATA-OUT by the interface circuit 202.

The analog BIST circuit 62 is provided for testing the LNA 44, and is a digitizer, for example. The analog BIST circuit 62 digitizes the RF signal RF2 output from the LNA 44 in a state in which an RF signal is supplied to the analog I/O port P5, and measures the amplitude level of the RF signal RF2. The amplitude level is output to the ATE 100 as the test data output signal DATA-OUT. The ATE 100 determines based upon the waveform level whether or not the LNA 44 is operating according to the waveform levels as designed.

The analog BIST circuit 60 and the analog BIST circuit 58 are provided for testing the image removal filter 42 and the local oscillator 40, respectively. The configurations and the operations thereof are the same as those of the analog BIST circuit 64. Accordingly, the analog BIST circuits 60, 58, and 64 may be configured as a single circuit, and the analog circuit to be measured may be switched according to the aforementioned mode.

The analog BIST circuit 56 is provided for testing the LPF 36. The configuration and the operation of the analog BIST circuit 56 are the same as those of the analog BIST circuit 62. Accordingly, the analog BIST circuits 56 and 62 may be configured as a single circuit. The analog BIST circuit is essentially a measurement device. However, such an arrangement requires only a function of testing a corresponding function block.

Accordingly, the analog BIST circuit can be configured in a simple manner. Description will be made regarding a spectrum analyzer as an example. General-purpose spectrum analyzers require high frequency resolution (several kHz or more) and a wide frequency band (from DC up to several GHz). However, the analog BIST circuit requires only a function of measuring a predetermined frequency range with the center frequency being the frequency band to be input to the DUT 200. Furthermore, the analog BIST circuit may have a low frequency resolution as long as it can check whether or not the corresponding analog circuit is operating normally. For example, with the bandwidth of the RF signal as $\Delta f$, the analog BIST circuit may have a frequency resolution of $\Delta f/n$ (n is a real number equal to 10 or less).

Furthermore, each of the digitizer, the A/D converter, and the D/A converter should be designed with required and sufficient resolutions for checking the corresponding function block.

Each BIST circuit is a circuit that is unnecessary for the actual operation mode of the DUT 200. Accordingly, the circuit scale thereof should be reduced as much as possible. However, in some cases, there is a need to perform calibration of such a BIST circuit in order to test each of the analog circuit blocks included in the DUT 200 with high precision. In particular, in a case in which a measurement circuit realized by means of a microfabrication process is to be operated with high precision and high resolution, a calibration function is indispensable to compensate for errors due to irregularities in the process and changes in temperature.

Figure 5:
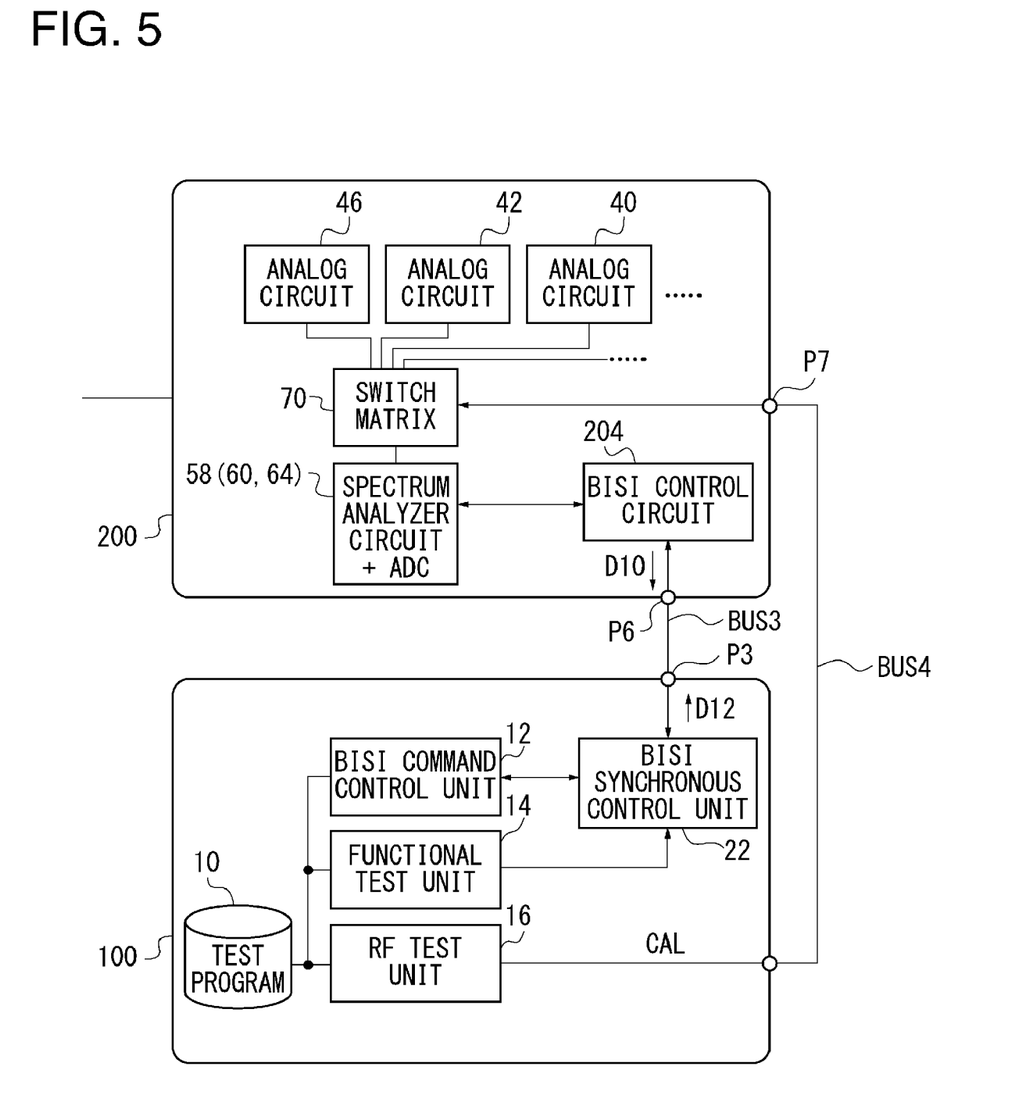
FIG. 5 is a block diagram which shows the configuration of the DUT having a calibration function for an analog BIST circuit.

Description will be made below regarding a calibration mechanism for the analog BIST circuit of the DUT 200. FIG. 5 is a block diagram which shows a configuration of the DUT 200 including the calibration mechanism for the analog BIST circuit. As described above, in the DUT 200 shown in FIG. 5, the single analog BIST circuit 58 is shared by the multiple analog circuits 40, 42, and 46.

A calibration port P7 is provided to the DUT 200. A calibration signal CAL is input from a test unit (the RF test unit 16 in FIG. 5) via a calibration bus BUS4. It should be noted that the calibration bus BUS4 and the analog main bus BUS2 may be provided in the form of a common bus.

A switch matrix 70 is provided between the multiple analog circuits 40, 42, and 46, and the analog BIST circuit 58. Multiple input terminals of the switch matrix 70 are connected to the output terminals of the analog circuits 40, 42, and 46, and the calibration port P7. An output terminal of the switch matrix 70 is connected to the analog BIST circuit 58.

The state of the switch matrix 70 is controlled according to the mode data MD of the aforementioned BIST selection signal BIST-SEL.

With the above-described configuration, a known calibration signal CAL can be input to the analog BIST circuit 58 via the switch matrix 70. The analog BIST circuit 58 outputs measurement data D10 according to the calibration signal CAL. The measurement data D10 is output to the ATE 100 via the BISI control circuit 202. The ATE 100 performs calibration of the analog BIST circuit 58 according to the relation between the calibration signal CAL and the measurement data D10. The calibration may be executed by a processor (CPU) which operates according to the test program 10. Also, any one of the test units may execute the calibration. A calibration control signal D12, which is used for calibrating the analog BIST circuit 58, is output as the test data input signal DATA-IN from the ATE 100 to the DUT 200. The analog BIST circuit 58 is calibrated according to the calibration control signal D12.

For example, in a case in which the analog BIST circuit 58 has a spectrum analysis function, the RF test unit 16 supplies an RF signal having a known frequency component to the calibration port P7 as the calibration signal CAL. In a case in which the measurement spectrum measured by the analog BIST circuit 58 does not match the frequency component of the calibration signal CAL, the analog BIST circuit 58 is calibrated according to the calibration control signal D12.

Lastly, description will be made regarding some specific examples of the tests which can be provided by the ATE 100 and the DUT 200 according to the embodiment. Description will be made below on the assumption that the digital BIST circuits (BIST1 and BIST2) perform the boundary scan tests of the memory circuit FB1 and the logic circuit FB2, and that the test of the D/A-A/D converter FB3 performed by the third BIST circuit BIST3 can be switched among three modes.

Test Example 1

In a case in which the boundary scan test of the memory circuit FB1 is performed by the first BIST circuit BIST1, first, only the first BIST circuit BIST1 is set to the active state according to the BIST selection signal BIST-SEL. That is to say, the BISI command control unit 12 generates the BIST selection signal BIST-SEL such that "1" is written to the BIST address of the first BIST circuit, and "0" is written to the other BIST addresses.

Subsequently, the BISI command control unit 12 asserts the start/stop signal START/STOP. Upon reception of the start/stop signal START/STOP, a pattern generator (pseudo random pattern generator), which is included within the BIST circuit BIST1 in the form of a built-in component, starts to generate a predetermined test pattern. The test pattern thus generated is transmitted via a daisy chain of flip-flops or latches formed in the memory circuit FB1. The BIST circuit BIST1 makes a comparison between the input pattern and the output pattern of the daisy chain, and determines whether or not the input pattern and the output pattern match each other. Thus, determination is made whether or not the memory circuit FB1 is operating normally, and the data which indicates the judgment result is stored at a predetermined address in a storage area (memory or register) included within the DUT 200.

Subsequently, using the test data output signal DATA-OUT, the BISI command control unit 12 specifies the address at which the data that indicates the judgment result is stored, and reads out the data which indicates the judgment result.

Test Example 2

The first BIST circuit BIST1 can operate in another mode (second mode). In the second mode, instead of using the pattern generator included within the DUT 200 in the form of a built-in component, a predetermined pattern may be generated by means of a pattern generator included within the ATE 100 in the form of a built-in component. The predetermined pattern thus generated may be supplied to the ATE 100 as the test data input signal DATA-IN.

In this case, first, the first BIST circuit BIST1 is set to the second mode according to the BIST selection signal BIST-SEL. Then, the start/stop signal START/STOP is asserted, and a predetermined pattern is supplied to the first BIST circuit BIST1 via the test control bus BUS3 using the test data input signal DATA-IN. The test pattern is transmitted via the daisy chain included within the memory circuit FB1, and is stored at a predetermined address in the storage area (memory or register) included within the DUT 200.

Subsequently, the BISI command control unit 12 specifies a predetermined address using the test data output signal DATA-OUT, and reads out data. The test pattern transmitted via the daisy chain is returned to the ATE 100 via the test control bus BUS3 as the test data output signal DATA-OUT. The ATE 100 makes a comparison between the test pattern supplied to the DUT 200 and the test pattern thus returned, and determines whether or not the DUT 200 is operating normally.

Also, the second BIST circuit provides the same tests for the logic circuit FB2 as the test example 1 and the test example 2.

Test Example 3

In a certain mode (first or second mode), the third BIST circuit BIST3 tests the D/A converter and the A/D converter in a state in which they are connected in series. In this mode, when a digital signal D1 is supplied to the input of the D/A converter, the digital signal D1 is converted into an analog signal A1, and the analog signal A1 is reconverted into a digital signal D2 by the A/D converter.

In the first mode, the digital value D1 is generated by the pattern generator included within the DUT 200 in the form of a built-in component. The third BIST circuit BIST3 makes a comparison between the digital values D1 and D2, and outputs data, which indicates the comparison result, to the ATE 100 as the test data output signal DATA-OUT.

In the second mode, the digital value D1 to be input to the D/A converter is supplied by the ATE 100 using the aforementioned test data input signal DATA-IN. The digital value D2 output from the A/D converter is returned to the ATE 100 as the test data output signal DATA-OUT. The ATE 100 makes a comparison between the test pattern supplied to the DUT 200 and the test pattern thus returned, and determines whether or not the DUT 200 is operating normally.

In the third mode, the A/D converter and the D/A converter are disconnected from each other. As shown in FIG. 4, an arbitrary waveform generator is mounted as the analog BIST circuit BIST3. The arbitrary waveform generator supplies a known analog waveform to the input of the A/D converter. The digital signal generated by the A/D converter is compared with an expected value by the analog BIST circuit BIST3 itself or the ATE 100, thereby testing the A/D converter.

Figure 6:
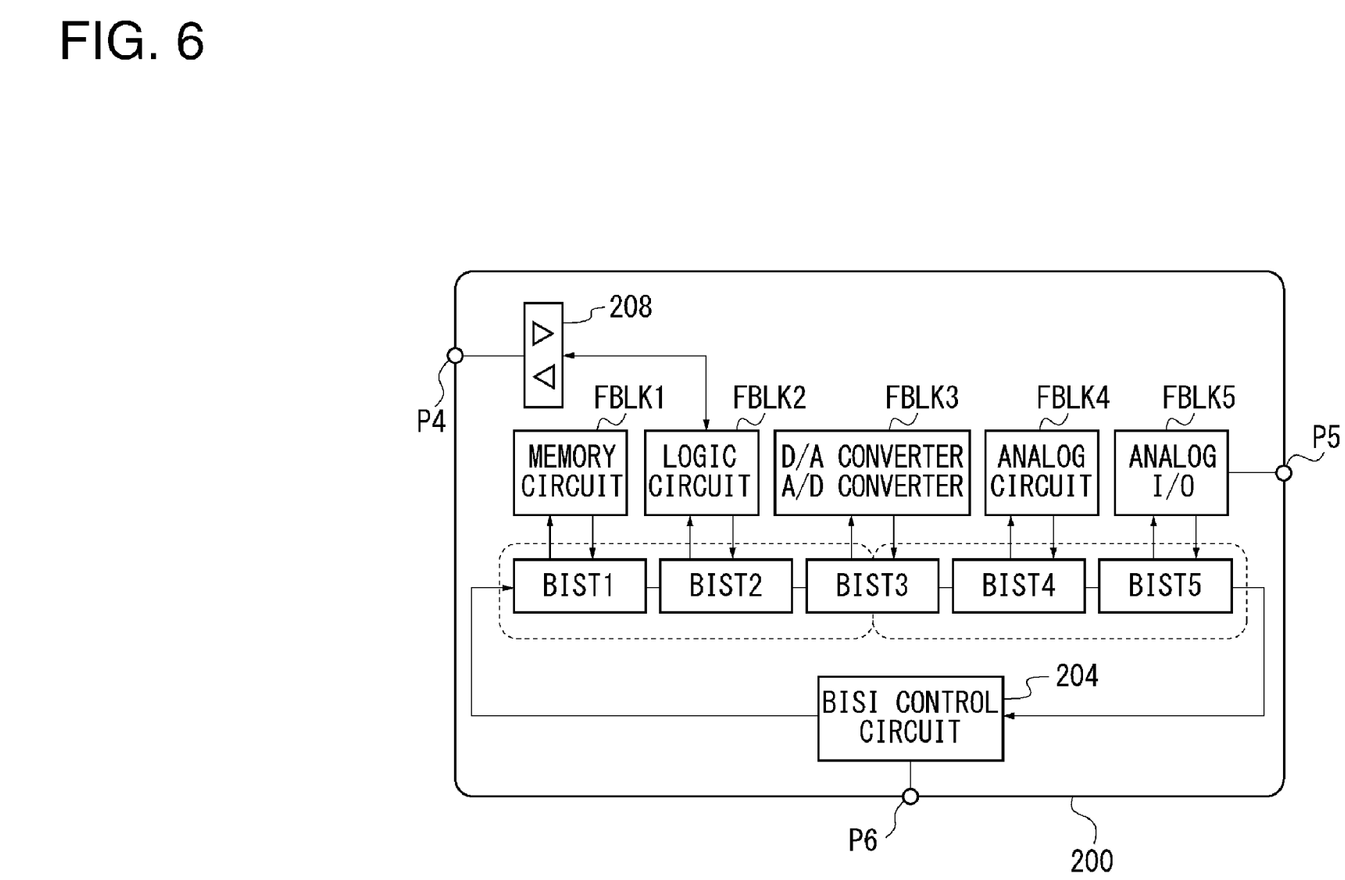
FIG. 6 is a block diagram which shows a configuration of the DUT according to a modification.

FIG. 6 is a block diagram which shows a configuration of the DUT 200 according to a modification. The DUT 200 shown in FIG. 1 has a configuration in which the multiple BIST circuits BIST1 through BIST5 are connected to the BISI control circuit 202 in the form of a tree structure. On the other hand, according to the modification, the multiple BIST circuits BIST1 through BIST5, and the BISI control circuit 202 are connected to one another via a ring bus.

While the preferred embodiments of the present invention have been described using specific terms, such description is for illustrative purposes only, and it is to be understood that changes and variations may be made without departing from the spirit or scope of the appended claims.

What is claimed is:

1. A test apparatus for a semiconductor device, wherein the semiconductor device includes:
    a plurality of function blocks which input/output signals via a main bus, and which execute predetermined signal processing;
    a plurality of BIST (Built-in Self Test) circuits which are provided in increments of function blocks, and each of which tests the corresponding function block, and generates a test result signal in the form of a digital signal according to the test result; and
    an interface circuit which is connected to the test apparatus via a test control bus that differs from the main bus, and which receives a control signal output from the test apparatus, and which is configured such that the interface circuit controls the plurality of BIST circuits according to the control signal, and such that the test result signal specified according to the control signal can be read out via the test control bus by the test apparatus,
    and wherein the test apparatus includes:
    a test unit which transmits/receives signals to/from the semiconductor device via the main bus, and which instructs at least one of the function blocks to execute the predetermined signal processing; and
    a control unit which generates a first control signal for individually controlling the plurality of BIST circuits included within the semiconductor device, and a second control signal for reading out the test result signal generated by the BIST circuit from the interface circuit included within the semiconductor device, and which supplies the first control signal and the second control signal to the semiconductor device via the test control bus.

2. A test apparatus according to claim 1, wherein the first control signal generated by the control unit includes at least a selection signal which indicates the BIST circuit that is to be set to the active state from among the plurality of BIST circuits.

3. A test apparatus according to claim 2, wherein at least one of the plurality of BIST circuits is configured such that it can be switched among a plurality of modes,
    and wherein the selection signal includes mode data for setting the mode.

4. A test apparatus according to claim 1, wherein the control unit further generates a third control signal including a test pattern to be supplied to each BIST circuit, and supplies the third control signal to the semiconductor device via the test control bus.

5. A test apparatus according to claim 1, wherein the control unit further generates a fourth control signal for instructing the BIST circuit to start or stop the test, and supplies the fourth control signal to the semiconductor device via the test control bus.

6. A test apparatus according to claim 1, wherein the control unit generates an option signal used for performing a unique control operation on at least one of the plurality of BIST circuits,
    and wherein the test control bus includes another signal line for transmitting the option signal, which differs from the first and second control signals.

7. A test apparatus according to claim 2, wherein, in a state in which the test unit transmits/receives signals to/from the semiconductor device, and at least one of the function blocks executes the predetermined-signal processing, the control unit sets the BIST circuit that corresponds to that function block to the active state, thereby testing that function block.

8. A test apparatus according to claim 7, further including a synchronous control unit which receives the control signal generated by the control unit, and outputs the control signal synchronously with the test rate provided by the test unit.

9. A test apparatus according to claim 1, wherein, of the plurality of BIST circuits the BIST circuit having the same function is shared by a plurality of function blocks.

10. A test apparatus according to claim 1, wherein at least one of the BIST circuits allows a calibration signal to be input via a calibration bus,
    and wherein the test unit of the test apparatus is configured such that it is capable of generating a calibration signal,
    and wherein the control unit acquires the test result signal generated as a result of the calibration signal processing performed by the BIST circuit, and generates a fifth control signal for calibrating the BIST circuit according to the test result signal.

11. A semiconductor device including:
    a plurality of function blocks which input/output signals via a main bus, and which execute predetermined signal processing;
    a plurality of BIST (Built-in Self Test) circuits which are provided in increments of function blocks, and each of which tests the corresponding function block, and generates a test result signal in the form of a digital signal according to the test result; and
    an interface circuit which receives a control signal output from a test apparatus via a test control bus that differs from the main bus, and which is configured such that the interface circuit controls the plurality of BIST circuits according to the control signal, and such that the test result signal specified according to the control signal can be read out via the test control bus by the test apparatus.

12. A semiconductor device according to claim 1, wherein the control signal includes at least a selection signal which indicates which of the plurality of BIST circuits is to be set to the active state, and a test data input signal including a test pattern to be supplied to the BIST circuit set to the active state,
    and wherein the BIST circuit set to the active state according to the selection signal receives the test data input signal, and tests the corresponding function block.

13. A semiconductor device according to claim 12, wherein at least one of the plurality of BIST circuits is configured such that it can be switched among a plurality of modes,
    and wherein the interface circuit sets the mode of the BIST circuit according to the mode data included in the selection signal.

14. A semiconductor device according to claim 12, wherein the BIST circuit set to the active state according to the selection signal starts or stops a test according to a start/stop signal included in the control signal.

15. A semiconductor device according to claim 11, wherein, in a state in which at least one function block executes the predetermined signal processing, the BIST circuit that corresponds to that function block tests that function block.

16. A semiconductor device according to claim 11, wherein, of the plurality of BIST circuits, the BIST circuit having the same function is shared by a plurality of function blocks.

17. A semiconductor device according to claim 11, wherein at least one of the BIST circuits allows a calibration signal to be input via a calibration bus, and wherein the BIST circuit outputs the result that is obtained by processing the calibration signal as the test result signal.

\* \* \* \* \*